United States Patent
Hoshihara et al.

(10) Patent No.: US 9,088,340 B2
(45) Date of Patent: Jul. 21, 2015

(54) WIRELESS COMMUNICATION APPARATUS

(75) Inventors: Yasunori Hoshihara, Tokyo (JP); Hisao Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 8 days.

(21) Appl. No.: 14/345,199

(22) PCT Filed: Dec. 21, 2011

(86) PCT No.: PCT/JP2011/007167
§ 371 (c)(1),
(2), (4) Date: Mar. 14, 2014

(87) PCT Pub. No.: WO2013/093969
PCT Pub. Date: Jun. 27, 2013

(65) Prior Publication Data
US 2014/0349594 A1    Nov. 27, 2014

(51) Int. Cl.
*H04B 7/00* (2006.01)
*H04B 1/401* (2015.01)
*H04B 1/10* (2006.01)
(Continued)

(52) U.S. Cl.
CPC .............. *H04B 1/401* (2013.01); *H03F 3/189* (2013.01); *H03F 3/245* (2013.01); *H03F 3/68* (2013.01); *H04B 1/109* (2013.01); *H04B 1/3827* (2013.01);
(Continued)

(58) Field of Classification Search
CPC ....... H04B 1/109; H04W 88/06; H04W 4/008
USPC ............. 455/41.1, 41.2, 73, 78, 550.1, 552.1, 455/130
See application file for complete search history.

(56) References Cited

U.S. PATENT DOCUMENTS

2005/0059347 A1 * 3/2005 Haartsen ............... 455/41.2
2006/0125684 A1   6/2006 Leinonen et al.
(Continued)

FOREIGN PATENT DOCUMENTS

JP   5-252061 A   9/1993
JP   10-28066 A   1/1998
(Continued)

OTHER PUBLICATIONS

German Office Action for German Application No. 112011106007.6, dated Oct. 24, 2014, along with an English translation of the relevant parts.
(Continued)

*Primary Examiner* — Tuan Pham
(74) *Attorney, Agent, or Firm* — Birch, Stewart, Kolasch & Birch, LLP

(57) ABSTRACT

A wireless communication apparatus includes: attenuators provided in wireless devices for attenuating an input level of a reception signal; a monitoring unit for monitoring communication states of the wireless devices; and a control unit that performs control to determine whether or not the input level of the reception signal of the wireless device to be controlled out of the wireless devices will be excessive because of a wireless communication to be performed by the second wireless device other than the wireless device to be controlled, based on the communication states of the wireless devices monitored by the monitoring unit and to attenuate the input level of the reception signal by operating the attenuator of the wireless device when determination is made that the input level of the reception signal will be excessive.

3 Claims, 12 Drawing Sheets

(51) Int. Cl.
  *H03F 3/189*  (2006.01)
  *H03F 3/24*   (2006.01)
  *H03F 3/68*   (2006.01)
  *H04B 1/3827* (2015.01)
  *H04W 88/06*  (2009.01)

(52) U.S. Cl.
  CPC ......... *H04W 88/06* (2013.01); *H03F 2200/294* (2013.01)

(56) References Cited

U.S. PATENT DOCUMENTS

| | | | |
|---|---|---|---|
| 2007/0230547 A1 | 10/2007 | Asai et al. | |
| 2012/0069766 A1* | 3/2012 | Fu et al. | 370/252 |
| 2012/0076061 A1* | 3/2012 | Desai | 370/311 |

FOREIGN PATENT DOCUMENTS

| | | |
|---|---|---|
| JP | 10-79683 A | 3/1998 |
| JP | 2007-243765 A | 9/2007 |
| JP | 2007-274390 A | 10/2007 |
| JP | 2008-172556 A | 7/2008 |
| JP | 2009-225043 A | 10/2009 |
| JP | 10-79783 A | 3/2010 |
| JP | 2010-88136 A | 4/2010 |

OTHER PUBLICATIONS

"New Era of TV: All you need to know about terrestrial digital broadcast", NHK Reception Engineering & Services Center, Mar. 2003.

IEEE Std 802.11-2012 (Revision of IEEE Std 802.11-2007), Part 11: Wireless LAN Medium Access Control (MAC) and Physical Layer (PHY) Specifications, Mar. 29, 2012.

Specification of the Bluetooth System, Specification vol. 0, Master Table of Contents & Compliance Requirements, Covered Core Package Version: 4.0, Current Master TOC, Publication Date: Dec. 17, 2009.

* cited by examiner

WIRELESS COMMUNICATION APPARATUS

TECHNICAL FIELD

The present invention relates to a wireless communication apparatus equipped with a plurality of wireless devices of respective wireless communication systems using the same frequency band.

BACKGROUND ART

A conventional common in-vehicle wireless communication apparatus includes, for example, a radio or TV broadcast receiver, a GPS (Global Positioning System) receiver, and a wave beacon receiver for detecting the position of an own vehicle.

With development of a wireless communication technology in recent years, there is a growing tendency to provide a wireless communication function to even various products or uses with which the wireless communication function has been not equipped so far for the purpose of increasing an added value thereto. Such products and uses have been accepted by users, and further its range of application for the products continues to expand.

The aforementioned tendency is similar in an in-vehicle information device around a car navigation system, and user applications introducing a variety of wireless technologies have been provided.

For example, the following are given: a toll payment with ETC (Electric Toll Collection system) (Registered trademark; its indication will be hereinafter omitted); an in-vehicle wireless communication system for a communication connection between a user device and the in-vehicle information device, or between the in-vehicle information devices through Bluetooth (Registered trademark; its indication will be hereinafter omitted), a wireless LAN (Local Area Network), and/or the like; a connection between a mobile phone and an outer communication system with the wireless LAN or the like; and an in-vehicle dedicated wireless audio transfer system. Also, the user applications employing these wireless technologies are increasingly installed in the in-vehicle information device.

In the meantime, when there coexist wireless communication apparatuses that perform a wireless communication by different communication systems using close frequencies, there is a possibility of degradation in the communication quality due to radio frequency interference, in other words, radio waves used by the mutual wireless communication apparatuses turn to noise. In particular, frequency channels in a wireless LAN and Bluetooth equipped in many products such as mobile phones, notebook PCs, and game devices use frequencies in a 2.4 GHz frequency band. For this reason, the aforementioned radio frequency interference tends to occur.

Additionally, an arrangement of the frequency channels in the wireless LAN is decided as disclosed in Non-Patent Document 1, and an arrangement of the frequency channels in Bluetooth is decided as disclosed in Non-Patent Document 2. Note that the frequency channels to be used are decided by an operation of each country.

Also, the 2.4 GHz band is called an ISM (Industrial Scientific and Medical) band, and has a less stringent operation regulation as compared with other frequency bands; a radio station's license therefor is unnecessary, and further its use is wide.

Particularly, it is widely used in various energy saving wireless data communication systems, and also used in a domestic microwave oven, a medical device, and so on other than the communication application.

Typical wireless communication systems that use the frequency in the 2.4 GHz band are wireless LANs and Bluetooth. These wireless communication systems have their own interference avoidance functions.

For example, in the wireless LAN, by a CSMA/CA (Carrier Sense Multiple Access with Collision Avoidance) function, whether or not a frequency band to be used by itself is being used by another wireless communication apparatus is determined by actually measuring a use condition of radio waves, and when a determination is made that the corresponding frequency band is not being used by another wireless communication apparatus, a communication thereof is carried out. In this way, radio wave interference and collision thereof with another wireless communication apparatus or a wireless communication apparatus of another wireless communication system are avoided.

It is noted that when another wireless LAN device or the wireless communication apparatus of another wireless communication system occupies the frequency band, a ratio occupied in the wireless communication of its own is reduced by that occupation, so that the transmission efficiency is lowered.

In Bluetooth, frequency hopping is carried out to perform spread spectrum communication, so that probability of radio wave interference in a specific frequency channel is lowered.

In addition, in Bluetooth, a communication state in each hoping frequency (hopping channel) is measured by using an AFH (Adaptive Frequency Hopping) function, the frequency in which the communication state gets worse due to radio wave interference and so on is removed from the hopping frequencies for non-use, so that the radio wave interference is avoided. However, since there is a lower limit in the number of the hopping frequencies, when a high percentage thereof in the use frequency band is subjected to the interference, the communication deterioration becomes larger.

Recently, a wireless communication apparatus in which wireless devices of different wireless communication systems of the wireless LAN, Bluetooth, and so on are equipped in one apparatus becomes widespread. In this wireless communication apparatus, when the wireless devices of respective communication systems are used simultaneously, the use frequency band is the same, and thus, deterioration of the communication quality occurs due to radio wave interference without performing appropriately allocation of the frequency channels or performing time sharing control even though the use frequency channels overlap each other.

As a conventional technique to avoid the aforementioned radio frequency interference, there are the following ones, for example:

In Patent Document 1, there is disclosed a composite wireless apparatus in which respective wireless devices of the wireless LAN and Bluetooth are equipped in one apparatus. In this apparatus, a control unit that controls the wireless channels of the two wireless devices performs control such that corresponding to the use frequency channels in the wireless LAN, the hopping frequencies in Bluetooth are not allocated to the frequency channels in the wireless LAN and these neighboring frequencies so as to be out of the carrier sense in the wireless LAN. In this manner, the radio frequency interference between the wireless devices equipped in the composite wireless apparatus is avoided.

In addition, in Patent Document 2, there is described an in-vehicle wireless communication apparatus in which respective wireless devices of the wireless LAN and Bluetooth are equipped in one apparatus. This apparatus includes:

an application for a connection with a mobile terminal located in the vehicle through Bluetooth; an application for a connection with a wireless LAN station device located outside the vehicle through the wireless LAN; and a storage unit that stores the communication area of the wireless LAN station device outside the vehicle, and the following are predicted: an own vehicle enters this communication area, and a use frequency channel in the connection through the wireless LAN. Thus, allocations of the use frequency channels are optimized for the connection with the mobile terminal located in the vehicle through Bluetooth and the connection with the wireless LAN station device through the wireless LAN to thus avoid the mutual radio frequency interference between the wireless devices of Bluetooth and the wireless LAN.

However, even if the frequency channels between the wireless devices are separated by the optimized frequency channel allocations, when the mutual interference level becomes larger, the reception level of the wireless communication apparatus becomes excessive, so that the reception signals are deteriorated, which may result in a state of disabled reception.

To deal with such an inconvenience, in Patent Document 3, a switch is provided at a reception part of a mobile wireless device, and an intensity detection of a reception signal is performed by I and Q signals after frequency conversion and orthogonal decoding; corresponding to a level thereof, an attenuator upstream of a low-noise decoder is turned on and off, and a bypass route of a low-noise amplifier is turned on and off, to thus reduce an influence by disturbance waves, namely interference waves.

Further, in Patent Document 4, there is disclosed a wireless device with a gain switching antenna that makes an antenna gain variable such that an antenna provided with a plurality of attenuators are switched by a switch. This wireless device performs control such that reception areas of a plurality of remote wireless devices using the same frequency channel arranged in the same site do not overlap each other in such a manner that a transmission area of its own station is provided variably by switching the antenna gain, thereby avoiding mutual radio wave frequency interference.

PRIOR ART DOCUMENTS

Patent Documents

Patent Document 1: Japanese Patent Application Laid-open No. 2008-172556
Patent Document 2: Japanese Patent Application Laid-open No. 2007-243765
Patent Document 3: Japanese Patent Application Laid-open No. H10-28066
Patent Document 4: Japanese Patent Application Laid-open No. H10-79683

Non-Patent Documents

Non-patent Document 1: IEEE-Std. 802.11TM—2007 IEEE Standard for Information technology—Telecommunications and information exchange between systems—Local and metropolitan area networks—Specific requirements Part 11: Wireless LAN Medium Access Control (MAC) and Physical Layer (PHY) Specifications.
Non-patent Document 2: BLUETOOTH SPECIFICATION Version 4.0+HS
Non-patent Document 3: "New Era of TV: All you need to know about terrestrial digital broadcast", NHK Reception Engineering & Services Center, March 2003

SUMMARY OF THE INVENTION

Problems to be Solved by the Invention

The radio waves emitted from the antenna of the wireless communication apparatus usually diffuse into space as the property of the waves. Therefore, when the radio waves are received at a place closer to the antenna, the reception level of the waves is higher, and when separated farther from the antenna, the reception level of the radio waves are lower.

Though at the reception part of the wireless communication apparatus, the reception level varies depending on its own existing place, a stable reception performance is required in such a situation.

However, if the reception level of the radio waves becomes too low, a state of disabled reception is assumed.

On the other hand, if the reception level becomes too high, a low-noise amplifier at the reception part operates in a non-linear region, and reception signals between the input and output of the low-noise amplifier are deteriorated, which may result in a state of disabled reception. Also, the same state may occur in a frequency converter downstream of the low-noise amplifier.

In a narrow closed space surrounded by a metal material like a vehicle interior, in particular, a wireless communication apparatus is often used in the vicinity of a transmission antenna. In addition, since diffusion of the radio waves is suppressed, as shown in FIG. 1, even if the apparatus is located somewhat away from the transmission antenna, the reception level (input level of the reception signal) is in a state that is not lower than a certain constant reception level a. Therefore, the input level of the low-noise amplifier at the reception part of the wireless communication apparatus needs to be controlled properly.

An inconvenience due to a fact that the radio waves are received at an excessive reception level as mentioned above cannot be resolved merely by controlling the use frequency channel allocation as in conventional techniques represented by Patent Documents 1 and 2.

On the other hand, as in the conventional techniques represented by Patent Documents 3 and 4, the influence of the interference waves by its own wireless communication system at the same frequency band can be reduced, and degradation of the communication quality can be suppressed.

However, in Patent Documents 3 and 4, in an environment where there coexist a plurality of wireless devices with respective wireless communication systems that use the same frequency band, there is no guarantee that the influence of the radio wave interference between the wireless devices of mutually different wireless communication systems can be reduced, so that degradation of the communication quality can be suppressed.

Here, let us consider now that in an in-vehicle wireless communication apparatus with which a wireless device in Bluetooth and a wireless device in the wireless LAN using the 2.4 GHz band are equipped, the wireless devices of the respective systems communicate with each other in a vehicle. As mentioned above, in the narrow closed space in the vehicle, the reception level of the received radio waves is relatively high in the wireless devices, which is sufficiently high for the reception parts of the wireless devices.

For example, in a commercially available wireless terminal, even if the reception level decreases to $1/100$ or lower from the current one, the reception performance is stable. Specifically, referring to FIG. 2 that shows a relationship between input level and output level of the low-noise amplifier in the reception part, even if the reception level (input level) is low, no deterioration of the reception signal occurs at a linear operation point, and thus the stable reception performance is exhibited.

On the other hand, as the reception level is further increased, the low-noise amplifier at the reception part may be driven from the linear operating point to a non-linear operating point, distortion in the reception signal as shown in FIG. 2 occurs, resulting in deterioration of the communication quality.

Even in a narrow closed space like a vehicle interior, there is no problem as long as only the Bluetooth wireless device or only the wireless LAN device is during communication; however, when simultaneous communications are carried out in the two wireless devices of the respective wireless communication systems, the reception parts receive the radio waves from both of Bluetooth and the wireless LAN to thus drive the low-noise amplifier to the non-linear operating point, which may result in deterioration of the reception performance and decrease in the transmission efficiency. In particular, when the wireless LAN device starts a communication in a case where the Bluetooth device is during communication, it is expected that the reception performance of the Bluetooth one is remarkably deteriorated.

As mentioned above, in a wireless communication apparatus equipped with a plurality of wireless devices of respective wireless communication systems installed in a narrow closed space like the vehicle interior, when the plurality of wireless device of the respective wireless communication systems are operated simultaneously, it is desirable that deterioration of reception performance due to a fact that the reception part receives the radio waves at an excessive level and a decrease in transmission efficiency accompanied by this is suppressed to thus achieve an improvement of the communication quality.

This invention is made to solve the foregoing problems, and an object of the invention is to provide a wireless communication apparatus that can suppress degradation of the reception performance even in a narrow closed space where radio waves hardly diffuse to the outside to thus achieve an improvement of the communication quality.

Means for Solving the Problem

A wireless communication apparatus of this invention is mounted with a plurality of wireless devices having different wireless communication systems using the same frequency band, and includes: an attenuator that is provided in each of the wireless devices and that attenuates an input level of a reception signal; a monitoring unit that monitors communication states of the wireless devices; and a control unit that performs control to determine whether or not the input level of the reception signal of the wireless device to be controlled out of the plurality of wireless devices will be excessive because of a wireless communication to be performed by the other wireless device other than the wireless device to be controlled, based on the communication states of the wireless devices monitored by the monitoring unit, and to attenuate the input level of the reception signal by operating the attenuator of the wireless device to be controlled when a determination is made that the input level of the reception signal will be excessive, wherein the control unit performs control to determine that when out of the plurality of wireless devices of the wireless communication systems, at least one of the other wireless devices other than the wireless device to be controlled is during communication connection while the wireless device to be controlled is during communication connection, the input level of the reception signal of the wireless device to be controlled will be excessive, and to attenuate the input level of the reception signal by operating the attenuator of the wireless device to be controlled, to determine that even when the other wireless device is not during communication connection, in a case where a master station of a wireless device that performs a wireless communication using the same wireless communication system as that of the other wireless device is detected and the input level of the signal received from the master station is equal to or higher than a predetermined threshold, the input level of the reception signal of the control target wireless device will be excessively high, and to attenuate the input level of the reception signal by operating the attenuator of the wireless device to be controlled, and to determine that when no master station of the wireless device is detected, or when the reception level of the master station is lower than a predetermined threshold, the input level of the reception signal of the wireless device to be controlled will not be excessive, and to prevent the attenuation of the input level of the reception signal without operating the attenuator of the wireless device to be controlled.

Effect of the Invention

According to this invention, there is an advantageous effect that can suppress degradation of the reception performance even in a narrow closed space where radio waves hardly diffuse to the outside to thus achieve an improvement of the communication quality.

BEST MODE FOR CARRYING OUT THE INVENTION

In the following, in order to explain the present invention in more detail, embodiments for carrying out the invention will be described with reference to the accompanying drawings.

Embodiment 1

Figure 3:
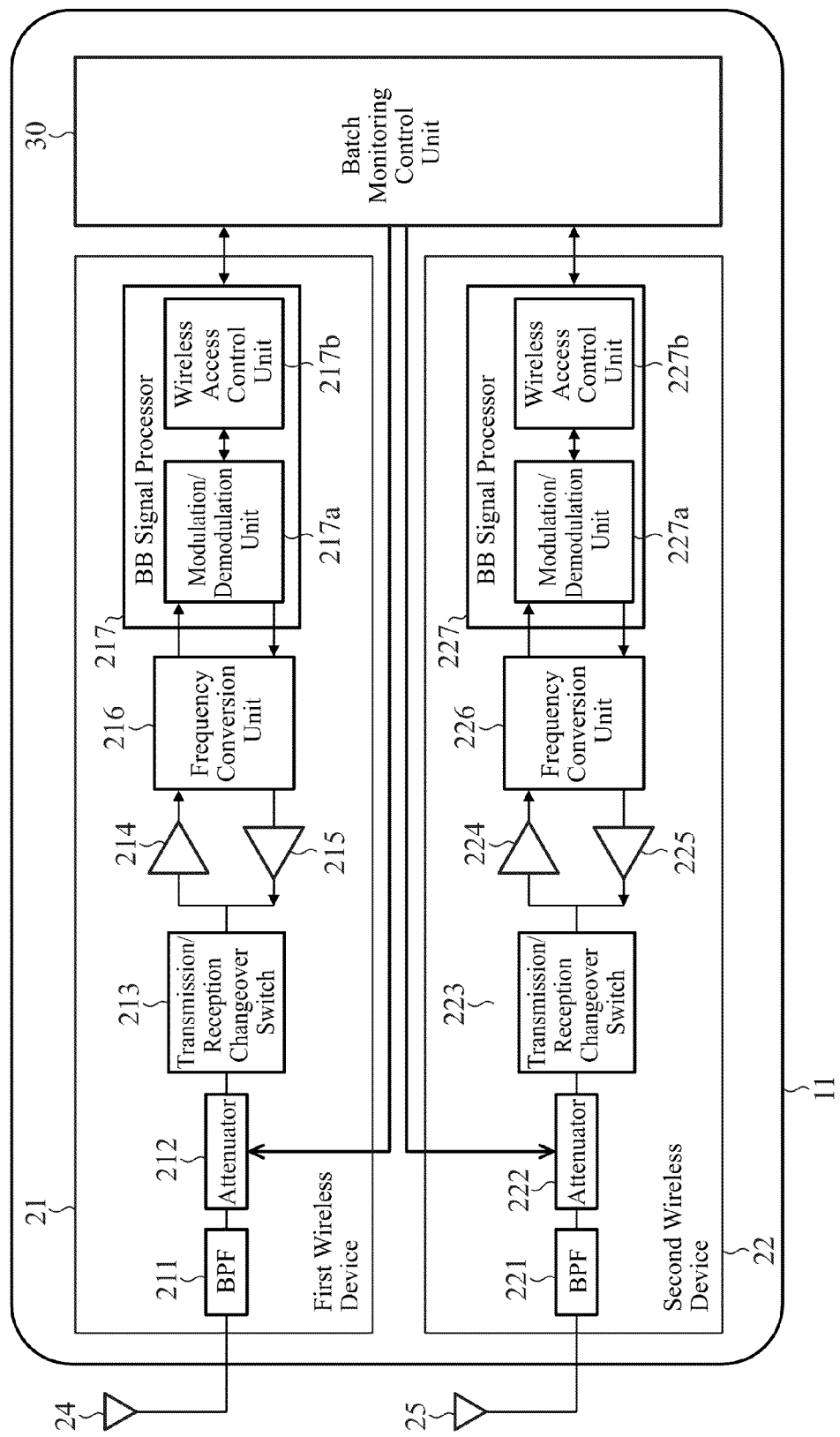
FIG. 3 is a block diagram illustrating a configuration of a wireless communication apparatus according to Embodiment 1 of this invention.

FIG. 3 is a block diagram illustrating a configuration of a wireless communication apparatus according to Embodiment 1 of this invention. The wireless communication apparatus 11 shown in FIG. 3 includes a first wireless device 21 and a second wireless device 22 having mutually different wireless communication systems, and includes a first antenna 24 and a second antenna 25 corresponding to the wireless devices 21 and 22 respectively, and a batch monitoring control unit 30 that monitors the communication states of the wireless devices 21 and 22 simultaneously and controls their operations. In this case, the wireless communication system of the first wireless device 21 is adapted to be Bluetooth, and the wireless communication system of the second wireless device 22 is adapted to be a wireless LAN.

Note that this invention is not limited to the configuration having the two wireless devices, but may be a configuration adding to a wireless device of another wireless communication system thereto.

Also, though there is shown the case in which the first antenna 24 and the second antenna 25 are provided as separate antennas in FIG. 3, the antennas may be collected by connecting the wireless devices 21 and 22 to the terminals of a single antenna via a combiner/distributor.

The respective wireless devices 21 and 22 include, as internal functional blocks, band-pass filters (BPF) 211 and 221, attenuators 212 and 222, transmission/reception changeover switches 212 and 223, low-noise amplifiers (LNA) 214 and 224, transmission amplifiers 215 and 225, frequency conversion units 216 and 226, and baseband (BB) signal processors 217 and 227. In addition, the respective BB signal processors 217 and 227 include modulation/demodulation units (modems) 217a and 227a, and wireless access control units 217b and 227b.

The band-pass filters (BPF) 211 and 221 are the ones that pass signals in frequency bands used by the wireless devices 21 and 22.

The attenuators 212 and 222 are the ones that attenuate reception signals passing through the BPF 211 and 221, and are adapted such that an ON/OFF setting thereof (through at the time of OFF) or an arbitrary attenuation setting is possible.

The transmission/reception changeover switches 213 and 223 are the ones that switch between reception paths and transmission paths in the wireless devices 21 and 22, respectively, and connect the attenuators 212 and 222 with the low-noise amplifiers 214 and 224 at the reception timings of the wireless devices 21 and 22, and connect the transmission amplifiers 215 and 225 with the attenuators 212 and 222 at the transmission timings thereof, respectively.

The low-noise amplifiers 214 and 224 amplify input levels of the reception signals, while the transmission amplifiers 215 and 225 amplify transmission signals.

The frequency conversion units 216 and 226 frequency-convert output signals (reception signals) of the low-noise amplifiers 214 and 224 to signals of intermediate frequencies or signals of frequencies that can be demodulated, and also frequency-convert output signals (transmission signals) of the BB signal processors 217 and 227 to high-frequency signals for respective wireless communications.

The BB signal processors 217 and 227 perform demodulation processing for output signals of the frequency conversion units 216 and 226, and reproduce baseband signals to extract reception data as well as generate baseband signals for wireless communications from transmission data inputted from the outside, and include modulation/demodulation units 217a and 227a, and wireless access control units 217b and 227b.

The modulation/demodulation units 217a and 227a perform demodulation processing for the output signals of the frequency conversion units 216 and 226, reproduce the baseband signals, and output the signals to the wireless access control units 217b and 227b as well as perform modulation processing for the transmission data input from the wireless access control units 217b and 227b to generate the baseband signals for wireless communications.

The wireless access control units 217b and 227b extract reception data from the baseband signals input from the modulation/demodulation units 217a and 227a, and output the data to the outside as well as the transmission data inputted from the outside to the modulation/demodulation units 217a and 227a. Note that the transmission data may be data transmitted from communication partners of the wireless devices 21 and 22, and data input with an input means (not shown).

Figure 4:
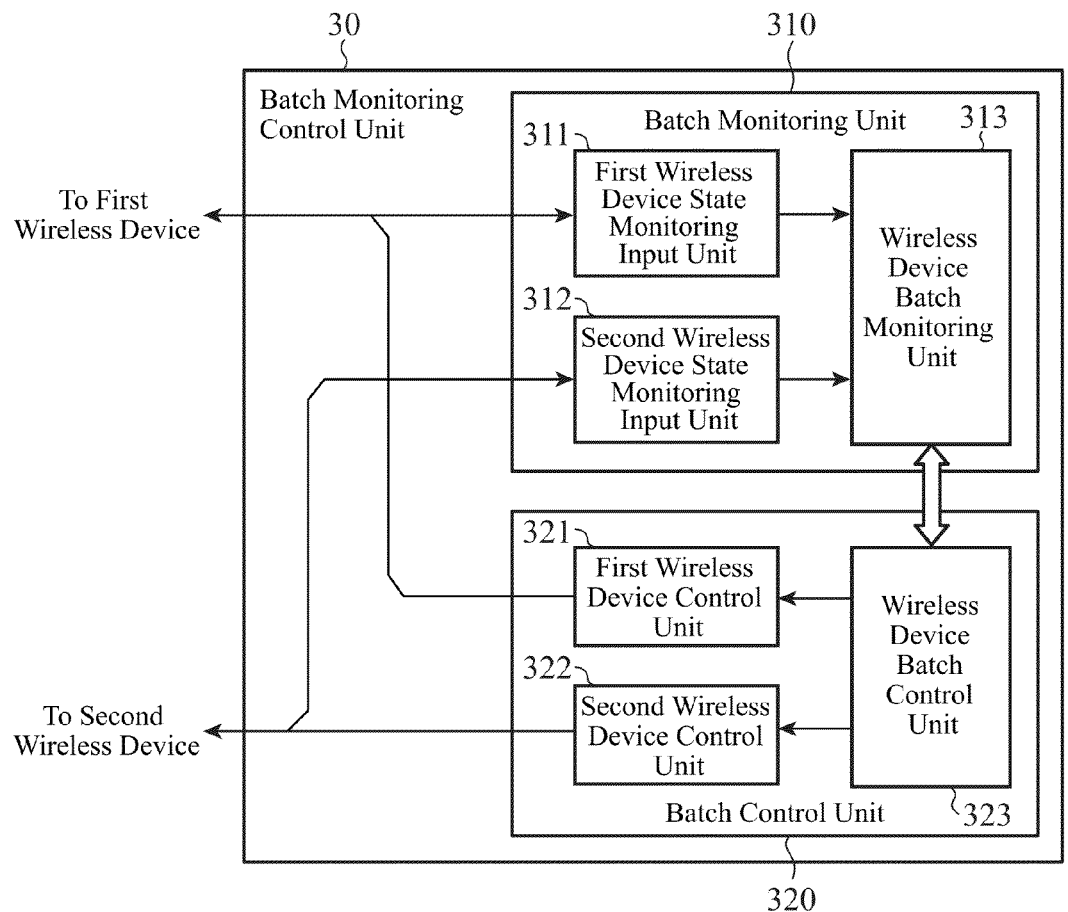
FIG. 4 is a block diagram illustrating a configuration of a batch monitoring control unit in FIG. 3.

The batch monitoring control unit 30 monitors the communication states of the wireless devices 21 and 22 simultaneously and controls their operations. FIG. 4 is a block diagram illustrating a configuration of the batch monitoring control unit in FIG. 3. As shown in FIG. 4, the batch monitoring control unit 30 includes a batch monitoring unit 310 and a batch control unit 320. In this case, the batch monitoring unit 310 includes a first wireless device state monitoring input unit 311, a second wireless device state monitoring input unit 312, and a wireless device batch monitoring unit 313; communication states of the wireless devices 21 and 22, for example, communications states specified from connection terminal IDs, use frequency channels, and input levels of reception signals (hereinafter, referred to as "reception levels") are obtained from the wireless device state monitoring input units 311 and 312, and stored in the wireless device batch monitoring unit 313.

Also, the batch control unit 320 includes a first wireless device control unit 321, a second wireless device control unit 322, and a wireless device batch control unit 323. The wireless device batch control unit 323 decides control contents of the wireless devices 21 and 22 based on the communication states of the wireless devices 21 and 22 readout from the wireless device batch monitoring unit 313, and notifies the first wireless device control unit 321 and the second wireless device control unit 322 of the contents. The first wireless device control unit 321 and the second wireless device control unit 322 control the wireless devices 21 and 22 independently of each other in accordance with the control contents decided by the wireless device batch control unit 323.

Figure 5:
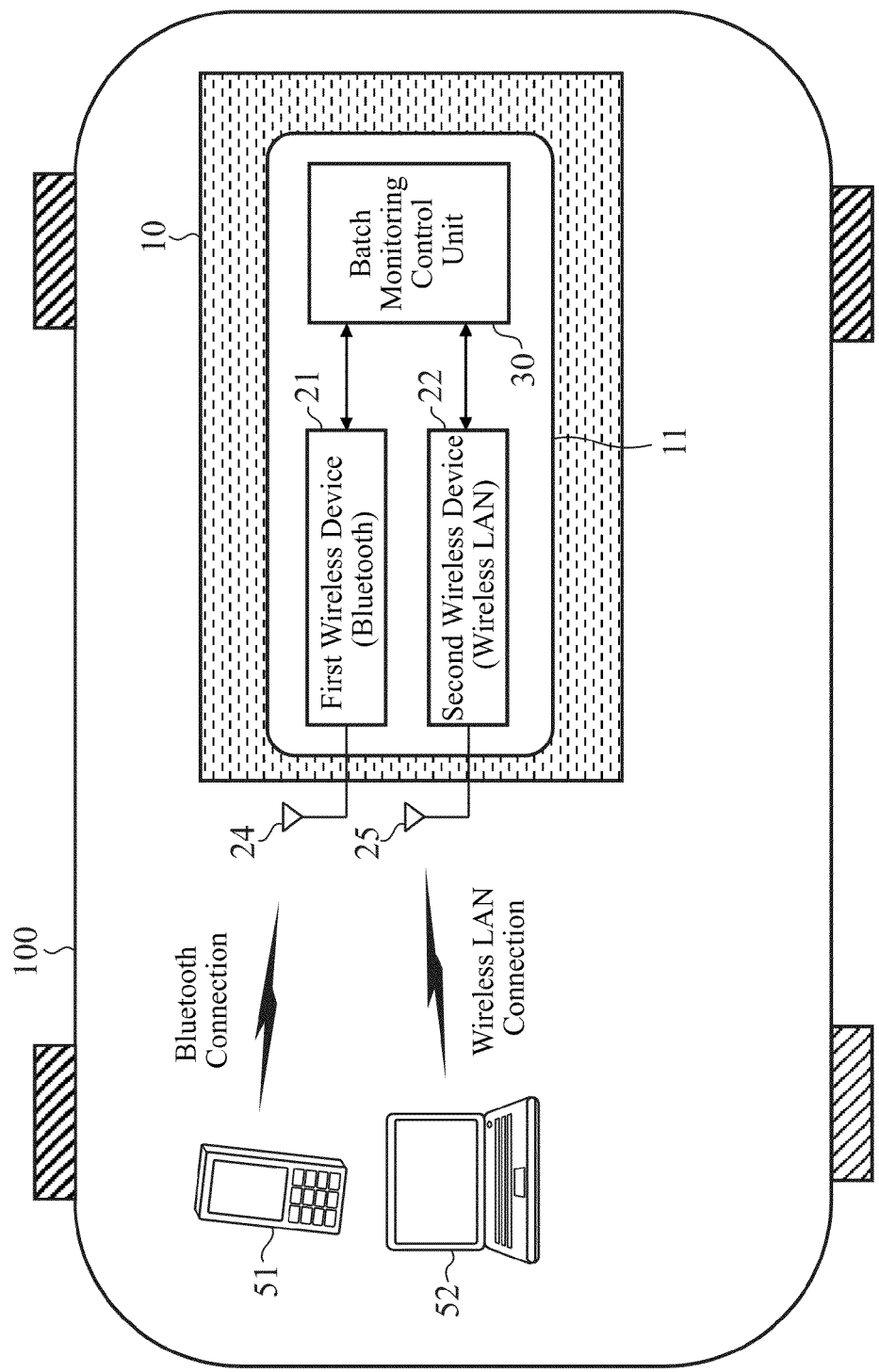
FIG. 5 is a diagram showing schematically a mode of communication connection in the wireless communication apparatus according to Embodiment 1.

FIG. 5 is a schematic diagram showing a mode of communication connection in the wireless communication apparatus according to Embodiment 1. An example shown in FIG. 5 shows a case in which an in-vehicle information apparatus 10 such as a car navigation system is installed in a vehicle 100, and the wireless communication apparatus 11 according to Embodiment 1 is incorporated in the in-vehicle information apparatus 10. The first wireless device 21 is wirelessly connected to a mobile phone 51 inside the vehicle 100 through Bluetooth to perform a hands-free call, while the second wireless device 22 is wirelessly connected to an information terminal 52 such as a personal computer brought into the vehicle 100 through the wireless LAN to perform data communication.

The wireless devices 21 and 22 include functions for avoiding radio wave interference independently. Specifically, the first wireless device 21 suppresses degradation of the communication quality such that when a communication state at each hoping frequency used in spread spectrum communication is monitored by using an AFH (Adaptive Frequency Hopping) function specified in Version 1.2 of Bluetooth SIG (Special Interest Group), the frequency in which the communication state is poor due to the interference and so on is removed from a hopping frequency list.

Also, the second wireless device 22 determines from measurement results in an actual use condition of the radio waves whether or not the frequency band used by itself is being used by wireless devices of another wireless LAN and another wireless communication system by a CSMA/CA function specified in IEEE802.11b/g/n.

Here, a communication is carried out when a determination is made that the band is not being used by a wireless LAN of other wireless devices other than a communication partner, and by wireless devices of other wireless communication systems; thus, the interference or collision with the other wireless LANs or the wireless devices of other wireless communication system are avoided.

Figure 6:
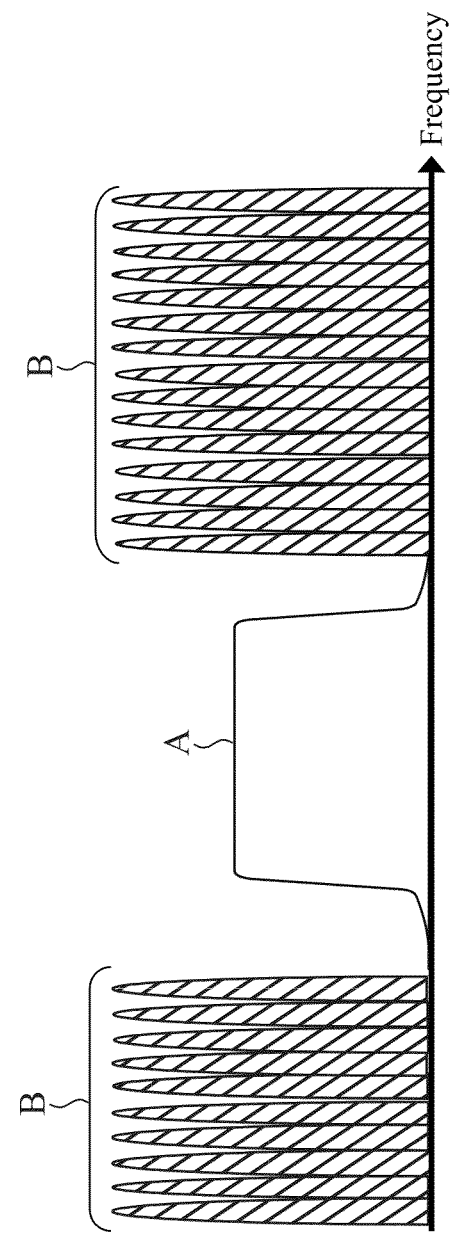
FIG. 6 is a diagram showing an example of use frequency channel allocation for Bluetooth and a wireless LAN.
Figure 7:
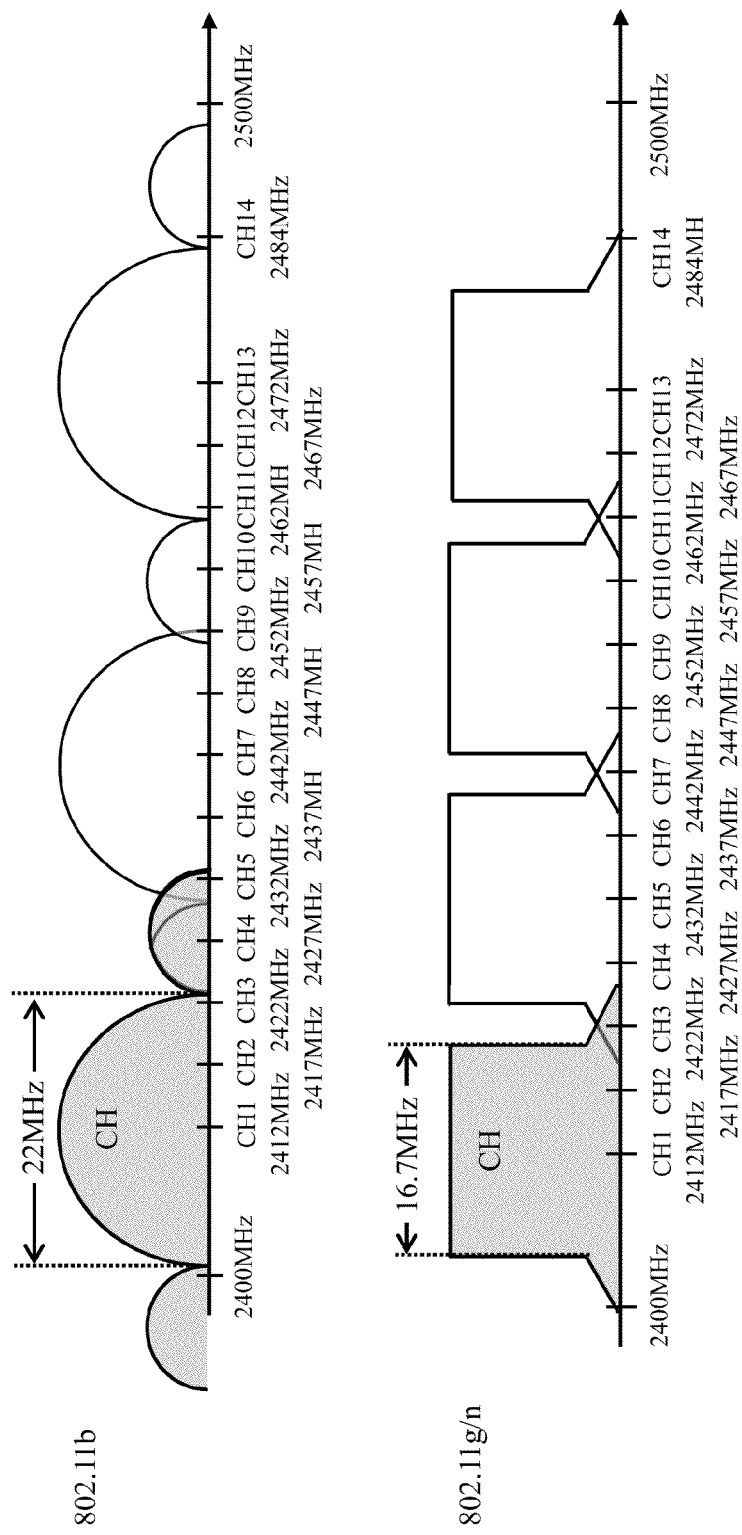
FIG. 7 is a diagram showing frequency channels of the wireless LAN.

FIG. 6 is a diagram showing an example of use frequency channel allocation for Bluetooth and a wireless LAN. In addition, FIG. 7 is a diagram showing frequency channels of the wireless LAN.

In Bluetooth, the spread spectrum communication is carried out such that the frequency hoping is repeated at 625 µs intervals for signals having a frequency width of 1 MHz (a total of 79 channels) in a frequency range of 2.402 GHz to 2.480 GHz. At this time, the channels whose communication conditions get worse because of an interference from the other wireless devices can be removed from the hopping frequency list by the AFH function. In addition, as shown in FIG. 7, in the wireless LAN, a communication is performed such that a frequency band of about 20 MHz per channel is occupied.

The frequency channels denoted by symbol A as shown in FIG. 6 correspond to the wireless LAN, while the frequency channels denoted by symbol B correspond to Bluetooth. Thus, it is conventionally configured such that the frequency channels are separated between Bluetooth and the wireless LAN to avoid a mutual interference therebetween and prevent a decrease in transmission efficiency of the wireless devices 21 and 22.

However, a case in which radio frequency interference is suppressed by controlling the frequency channel allocation is the one such that the reception levels of the wireless devices 21 and 22 are not excessive.

Figure 8:
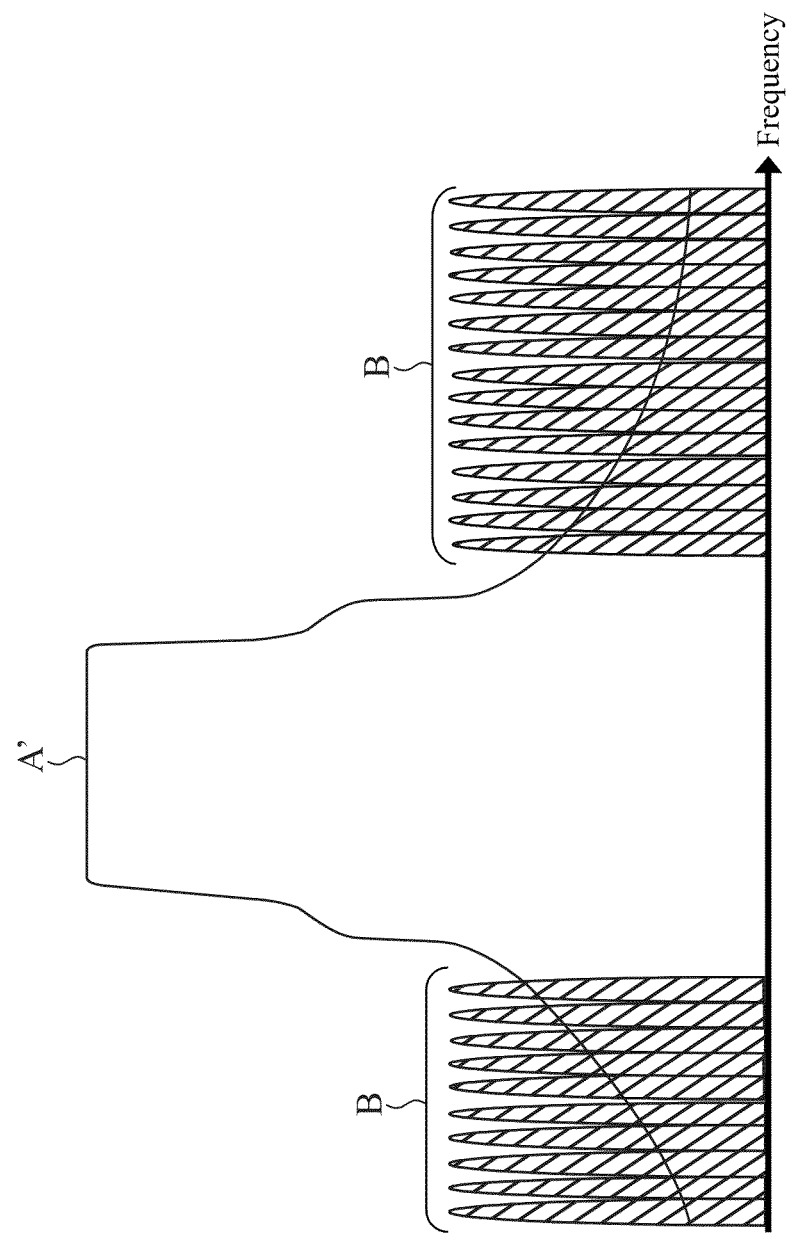
FIG. 8 is a diagram showing frequency channels of Bluetooth and a wireless LAN when a reception level of the wireless LAN is excessive.

In an environment shown in FIG. 5, when a wireless LAN communication by the second wireless device 22 is started while the first wireless device 21 performs a Bluetooth communication, the reception part of the first wireless device 21, as shown in FIG. 8, becomes an excessive input depending on a location where the information terminal 52 that communicates with the second wireless device 22 is arranged. In an example of FIG. 8, the reception level in the frequency channels of the wireless LAN is increased on the whole (see symbol A' in FIG. 8), and the reception level in the frequency channels overlapping the channels of Bluetooth (see B in FIG. 8) is increased. Thus, when the communication is carried out in these frequency channels, the reception part of the first wireless device 21 becomes the excessive input; thus, the low-noise amplifier 214 operates in a non-linear region to deteriorate the reception signal, which may result in a disabled reception.

Figure 1:
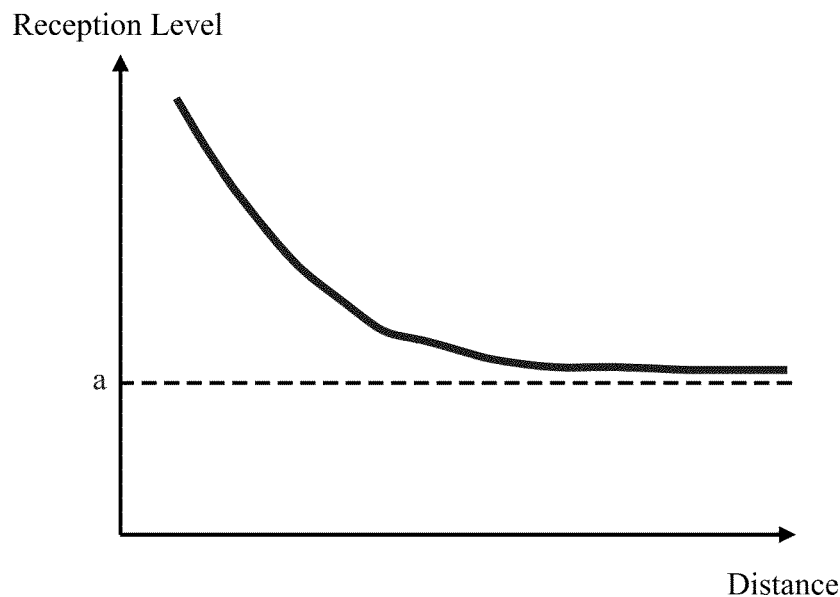
FIG. 1 is a graph showing radio wave propagation characteristics in a narrow closed space enclosed by a metal material.
Figure 2:
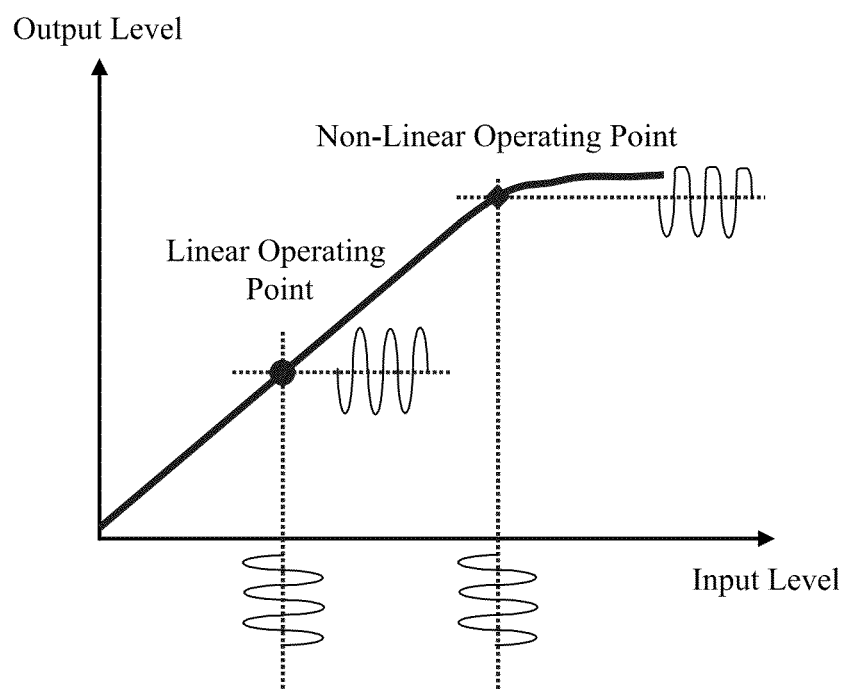
FIG. 2 is a graph showing a relationship between input level and output level of a low-noise amplifier.

On the other hand, as shown in FIG. 1, the reception level of wireless signals in a vehicle space is converged to a certain level, and in a relatively high state.

Thus, in Embodiment 1, in the aforementioned case, the excessive input is prevented using the attenuator 212, and the reception level is attenuated in the range of the reception level that provides a stable operation, thereby suppressing degradation of the communication quality.

Next, an operation thereof will be described.

Figure 9:
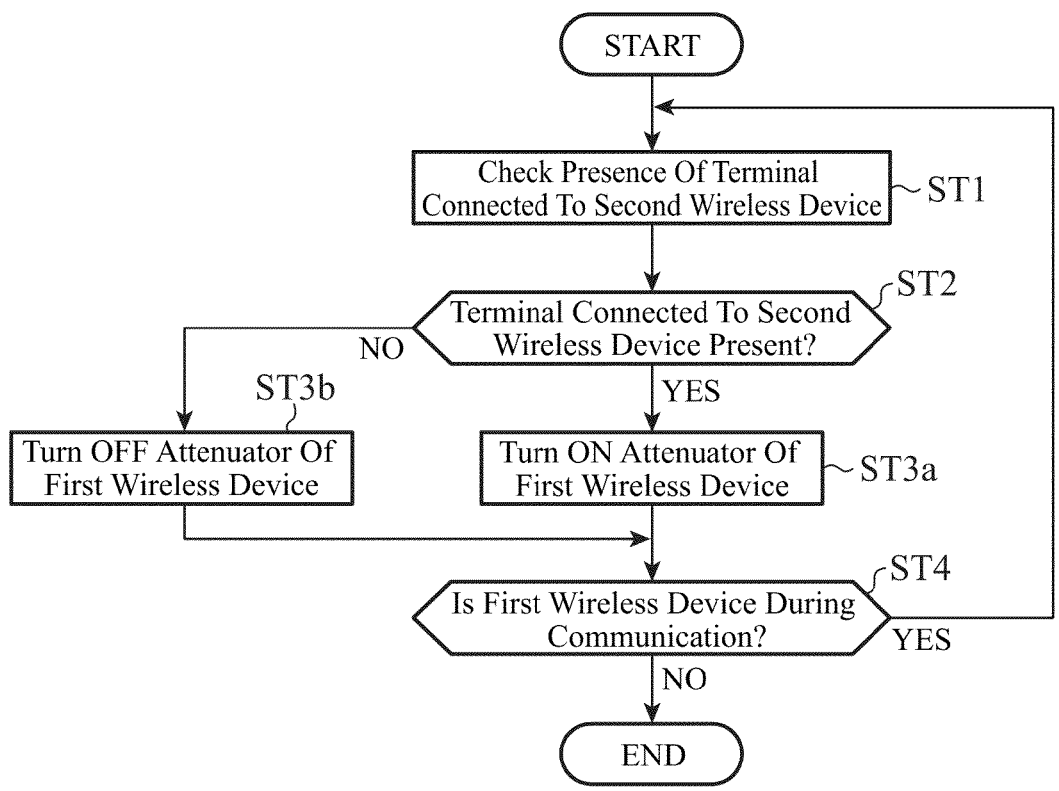
FIG. 9 is a flowchart showing an operation of the wireless communication apparatus according to Embodiment 1.

FIG. 9 is a flowchart showing an operation of the wireless communication apparatus according to Embodiment 1, and shows a case that performs control such that when the Bluetooth communication by the first wireless device 21 is influenced by the wireless LAN of the second wireless device 22, the excessive input at the reception part of the first wireless device 21 is prevented.

First, by referring to connection terminal IDs stored in the wireless device batch monitoring unit 313 via the second wireless device state monitoring input unit 312, the wireless device batch control unit 323 in the batch monitoring control unit 30 checks whether or not a terminal communication-connected with the second wireless device 22 through the wireless LAN is present (step ST1).

At this stage, if a terminal that is communication-connected with the second wireless device 22 through the wireless LAN is present (YES at step ST2), the wireless device batch control unit 323 determines that the reception level at the reception part of the first wireless device 21 becomes excessive, decides to perform control of attenuating the reception level of the first wireless device 21, and notifies the first wireless device control unit 321 of this control contents. The first wireless device control unit 321 sets the attenuator 212 to ON (attenuation implemented) in accordance with the control contents notified from the wireless device batch control unit 323 (step ST3a). Thus, an excessive input is suppressed at the reception part of the first wireless device 21, namely, the low-noise amplifier 214, when the first wireless device 21 and the second wireless device 22 operate at the same time.

On the other hand, if the terminal communication-connected with the second wireless device 22 by the wireless LAN is absent (NO at step ST2), the wireless device batch control unit 323 determines that an excessive input at the low-noise amplifier 214 is also absent when the first wireless device 21 and the second wireless device 22 operate at the same time, and notifies the first wireless device control unit 321 of this control contents. The first wireless device control unit 321 sets the attenuator 212 to OFF (attenuation not implemented) in accordance with the control contents notified from the wireless device batch control unit 323 (step ST3b).

Next, the wireless device batch control unit 323 determines whether or not the first wireless device 21 is during communication based on the connection terminal IDs, use frequency channels, and reception levels stored in the wireless device batch monitoring unit 313 via the first wireless device state monitoring input unit 311 (step ST4).

At this stage, if the first wireless device 21 is during communication (YES at step ST4), the wireless device batch control unit 323 returns to step ST1, and repeats the processing of step ST1 to step ST4. This is repeatedly controlled at constant intervals (for example, 500 ms) since the communication state of the second wireless device 22 changes with the lapse of time even during the communication of the first wireless device 21.

On the other hand, If the first wireless device 21 is not during communication (NO at step ST4), the wireless device batch control unit 323 ends the communication control of the first wireless device 21.

In this way, while the batch monitoring unit 310 monitors the communication state of the second wireless device 22, the batch control unit 320 sets ON/OFF the attenuator 212 at the reception part of the first wireless device 21 corresponding to the state of connection with the terminal.

Note that when the wireless communication apparatus 11 according to Embodiment 1 is equipped with three or more wireless devices of respective wireless communication systems, the batch control unit 320 performs control such that: when out of these wireless devices, at least one of the other wireless devices (second wireless device 22 in the aforementioned case) other than the wireless device to be controlled is during communication connection while the wireless device to be controlled (first wireless device 21 in the aforementioned case) is during communication connection, the input level of the reception signal is attenuated by operating the attenuator of the wireless device to be controlled; and when the other wireless device is not during communication connection, the input level of the reception signal is not attenuated without operating the attenuator of the wireless device to be controlled. By doing so, the control can be performed such that degradation of reception performance due to the excessive input at the low-noise amplifier 214 is suppressed to thus prevent reduction of the transmission efficiency.

Additionally, the wireless communication apparatus according to Embodiment 1 may be configured as follows.

Figure 10:
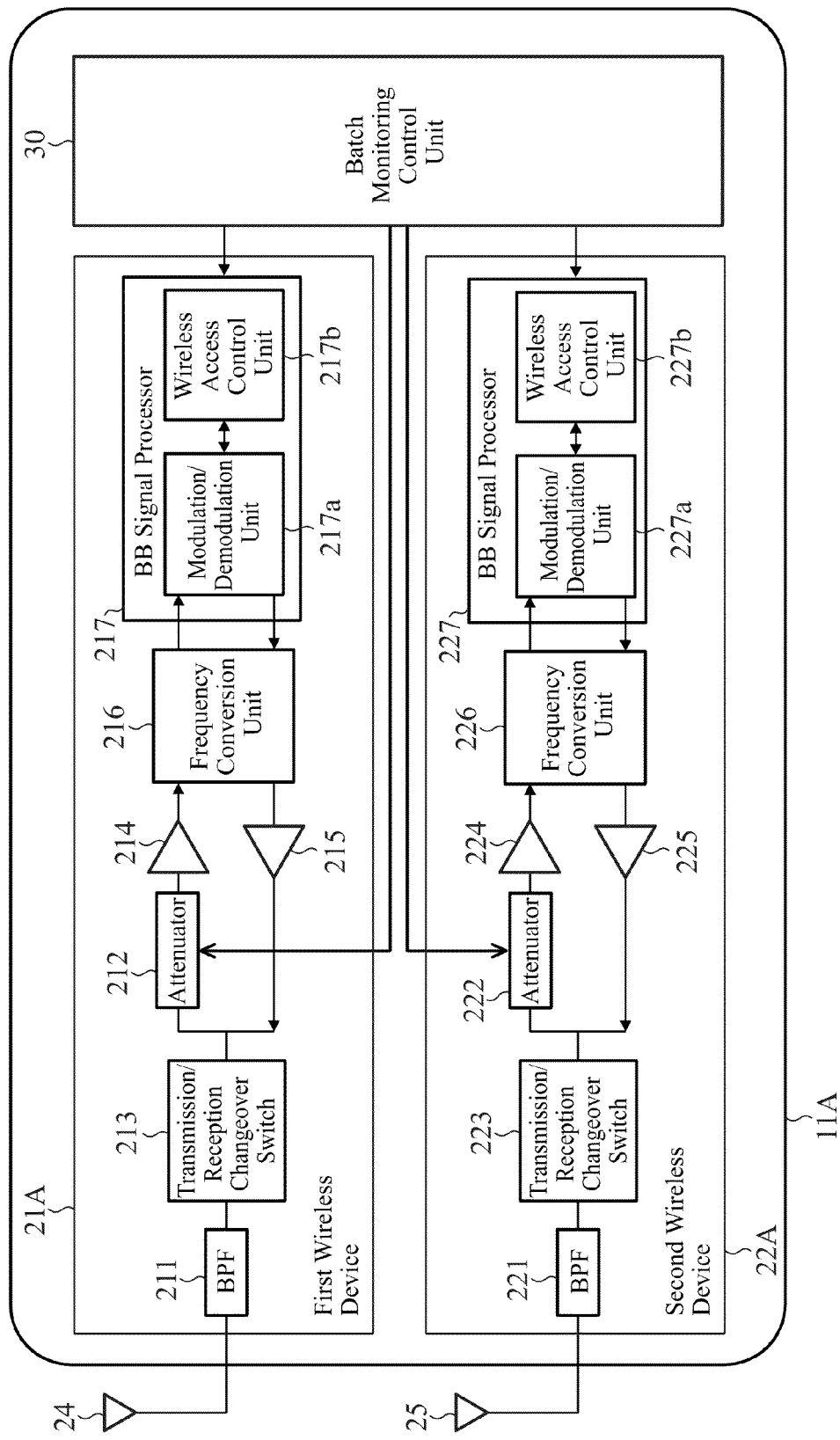
FIG. 10 is a block diagram illustrating another configuration of the wireless communication apparatus according to Embodiment 1.

FIG. 10 is a block diagram illustrating another configuration of the wireless communication apparatus according to Embodiment 1. In the wireless devices 21A and 22A of the wireless communication apparatus 11A shown in FIG. 10, the attenuators 212 and 222 are arranged downstream of the transmission/reception changeover switches 213 and 223. The same effects as the above can be achieved by this configuration.

Figure 11:
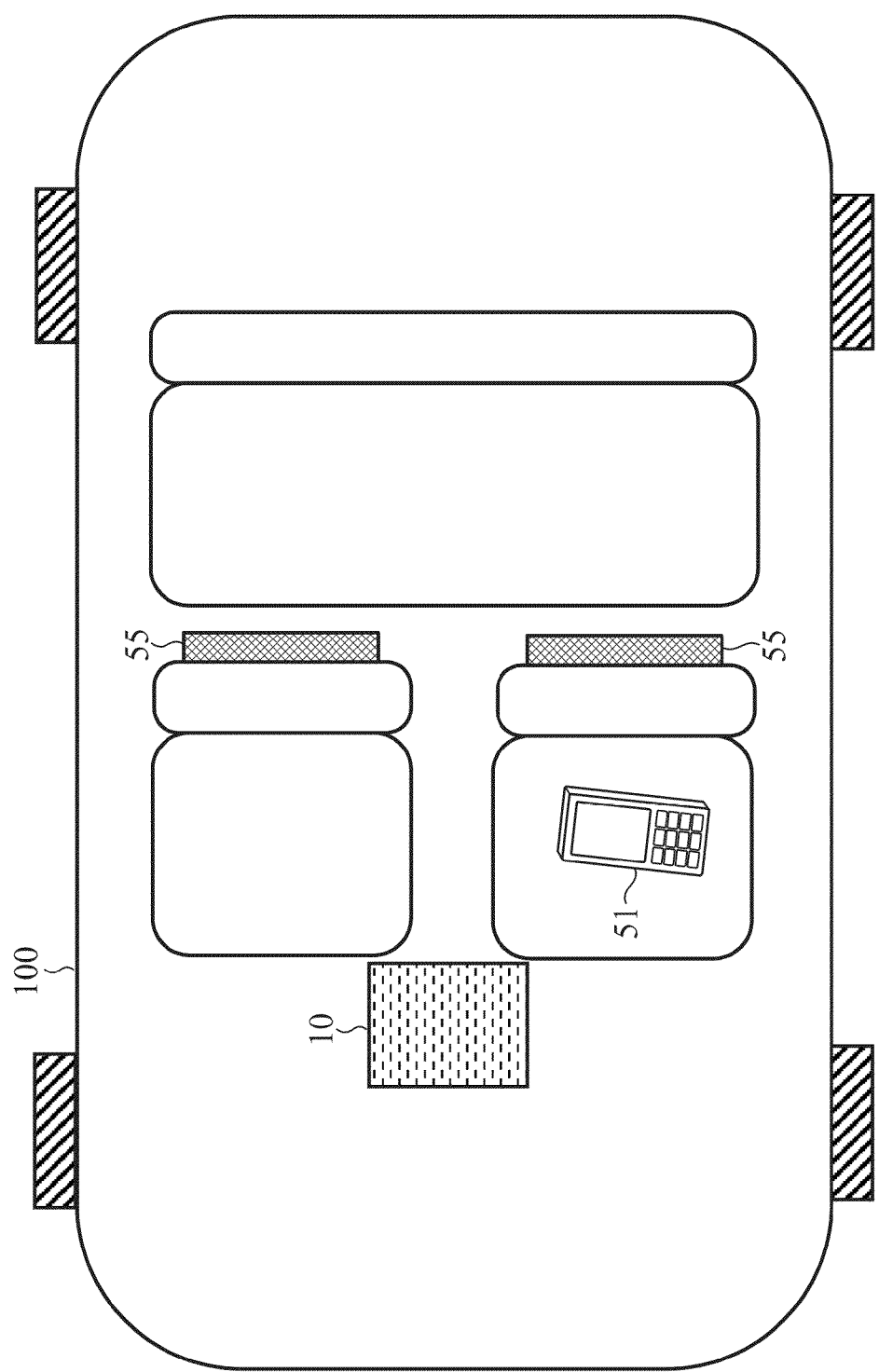
FIG. 11 is a schematic diagram showing another mode of communication connection in the wireless communication apparatus according to Embodiment 1.

FIG. 11 is a schematic diagram showing another mode of the communication connection in the wireless communication apparatus according to Embodiment 1. As shown in FIG. 11, let us consider a case in which the second wireless device 22 communicates with installation fixed wireless devices 55 whose installation fixed positions and terminal IDs are known in the vehicle 100. In this case, in addition to the terminal IDs and installation fixed positions of the installation fixed wireless devices 55, the amount of attenuation of an appropriate reception level in which no excessive input occurs at the reception part of the first wireless device 21, even if the installation fixed wireless device 55 performs a communication through the wireless LAN at this position, is stored in advance in the wireless device batch monitoring unit 313.

Then, when the wireless device batch control unit 323 determines that a terminal communication-connected with the second wireless device 22 through the wireless LAN is present, by referring to the stored contents in the wireless device batch monitoring unit 313 at step ST3a shown in FIG. 9, the unit specifies the fixed installation position from the terminal ID of the installation fixed wireless device 55, acquires an appropriate amount of attenuation corresponding to this position, and notifies the first wireless device control unit 321 to attenuate the level with this amount of attenuation. The first wireless device control unit 321 controls the attenuator 212 to attenuate the level with the amount of attenuation designated by the wireless device batch control unit 323. By doing so, the influence by the wireless LAN connection of the installation fixed wireless device 55 can be appropriately suppressed.

As described above, according to Embodiment 1, the apparatus includes: the attenuators 212 and 222, provided in the respective wireless devices 21 and 22, for attenuating the input levels of the reception signals, the batch monitoring unit 310 for monitoring the communication states of the wireless devices 21 and 22; and a batch control unit 320 that performs control to determine whether or not the input level of the reception signal of the first wireless device 21 to be controlled out of the wireless devices 21 and 22 will be excessive because of a wireless communication performed by the second wireless device 22 that is the other wireless device other than the wireless device 21 to be controlled, based on the communication states of the wireless devices 21 and 22 monitored by the batch monitoring unit 310, and to attenuate the input level of the reception signal by operating the attenuator 212 of the first wireless device 21 when a determination is made that the input level of the reception signal will be excessive. With this configuration, degradation of reception performance of one wireless device (first wireless device 21) due to a wireless communication of another wireless device (second wireless device 22) of its own in a narrow closed space such as the vehicle 100 where radio waves hardly diffuse to the outside can be suppressed to thus achieve an improvement of the communication quality.

In addition, according to this Embodiment 1, the batch control unit 320 performs control to determine that when out of the plurality of wireless devices 21 and 22, the second wireless device 22 that is the other wireless device other than the device 21 is during communication connection while the wireless device 21 to be controlled is during communication connection, the input level of the reception signal of the first wireless device 21 will be excessive, and to attenuate the input level of the reception signal by operating the attenuator 212 of the first wireless device 21, and to determine that when the second wireless device 22 is not during communication connection, the input level of the reception signal of the first wireless device 21 will not be excessive, and to prevent the attenuation of the input level of the reception signal without operating the attenuator 212 of the first wireless device 21. By doing so, when the input level of the reception signal of the wireless device 21 to be controlled will be excessive, the input level of the reception signal can be attenuated precisely.

Further, according to this Embodiment 1, the batch monitoring unit 310 preliminarily stores the IDs for identifying the installation fixed wireless device 55 that is to be a communication partner, the installation position of the installation fixed wireless device 55, and the amount of attenuation with which the input level of the reception signal of the first wireless device 21 is attenuated when the installation fixed wireless device 55 performs wireless communication with the second wireless device 22 at this installation position, and the batch control unit 320 performs control to determine that the input level of the reception signal of the first wireless device 21 will be excessive when a detection is made that the second wireless device 22 is during wireless communication with the installation fixed wireless device 55, based on communication states of the wireless devices 21 and 22 monitored by the batch monitoring unit 310, the IDs, and the installation position, and to attenuate the input level of the reception signal in accordance with the amount of attenuation stored in the batch monitoring unit 310 by operating the attenuator 212 of the first wireless device 21. With this configuration, also, when the input level of the reception signal of the wireless device 21 to be controlled will be excessive, the input level of the reception signal can be attenuated precisely.

Embodiment 2

Figure 12:
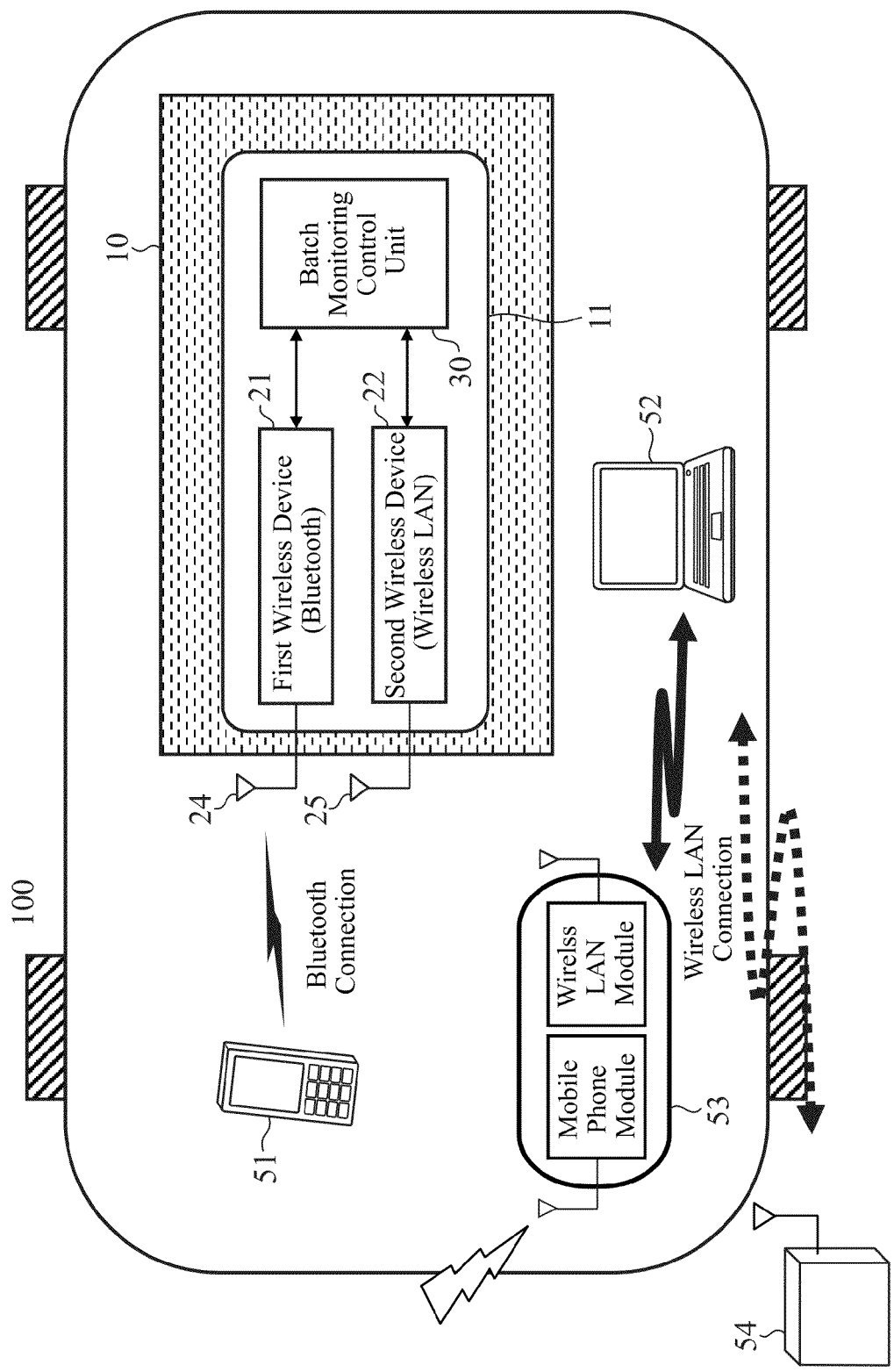
FIG. 12 is a diagram showing schematically a mode of communication connection in a wireless communication apparatus according to Embodiment 2 of this invention.

FIG. 12 is a diagram showing schematically a mode of a communication connection in a wireless communication apparatus according to Embodiment 2 of this invention, and assumes a case in which, in addition to the wireless communication apparatus 11 incorporated in the in-vehicle information apparatus 10, a wireless LAN terminal is located inside the vehicle 100 (vehicle interior) or outside the vehicle 100 (in the vicinity outside the vehicle). In an example of FIG. 12, there is shown a case in which the wireless LAN terminal inside the vehicle 100 is a wireless rooter 53 brought into by a passenger, and the neighboring wireless LAN terminal outside the vehicle 100 is a wireless LAN access point 54.

The wireless rooter 53 is a communication terminal that includes a mobile phone module that relays calls and data communications between mobile phones via a mobile phone network, and a wireless LAN module that relays wireless LAN communications with an information terminal 52 such as a personal computer inside the vehicle 100. In the example of FIG. 12, the information terminal 52 performs communication through the wireless LAN through the wireless rooter 53, and is in a condition to be communication-connectable to the wireless LAN access point 54 through the wireless LAN.

As mentioned above, even in a condition where a wireless LAN communication is performed inside the vehicle 100 or in the vicinity outside the vehicle 100 independently of the second wireless device 22 equipped in the wireless communication apparatus 11, similarly to the above Embodiment 1, the reception part of the first wireless device 21 may become an excessive input when influenced by these communication connections through the wireless LAN.

Namely, in a case where the first wireless device 21 is communication-connected with the mobile phone 51 through Bluetooth, when the information terminal 52 communicates with the wireless rooter 53 through the wireless LAN, or the information terminal 52 communicates with the wireless LAN access point 54 through the wireless LAN, the reception part of the first wireless device 21 receives signals of use frequency channels in the wireless LAN at an excessive reception level. In this case, as described in the above Embodiment 1, the signals are deteriorated between the input and output of the low-noise amplifier 214, which may lead to disabled receptions.

Thus, in Embodiment 2, by monitoring the neighboring wireless devices in addition to the wireless devices 21 and 22 equipped in the wireless communication apparatus 11, control is performed suppressing the excessive input at the reception part of its own wireless device caused by communications by the neighbouring wireless devices.

A configuration of the wireless communication apparatus 11 according to Embodiment 2 is basically the same as that of the above Embodiment 1 described with reference to FIG. 3 and FIG. 4; however, Embodiment 2 is different therefrom in that a communication state of another communication apparatus inside the vehicle 100 or in the vicinity outside the vehicle 100 is monitored, influence in the communication of its own wireless devices is analyzed, and control is performed in accordance with this analyzed results.

Since these operations are performed by the same configuration as that of the above Embodiment 1 as described later, the configuration of the wireless communication apparatus 11 according to Embodiment 2 will be described with reference to FIG. 3 and FIG. 4.

Next, an operation thereof will be described.

Figure 13:
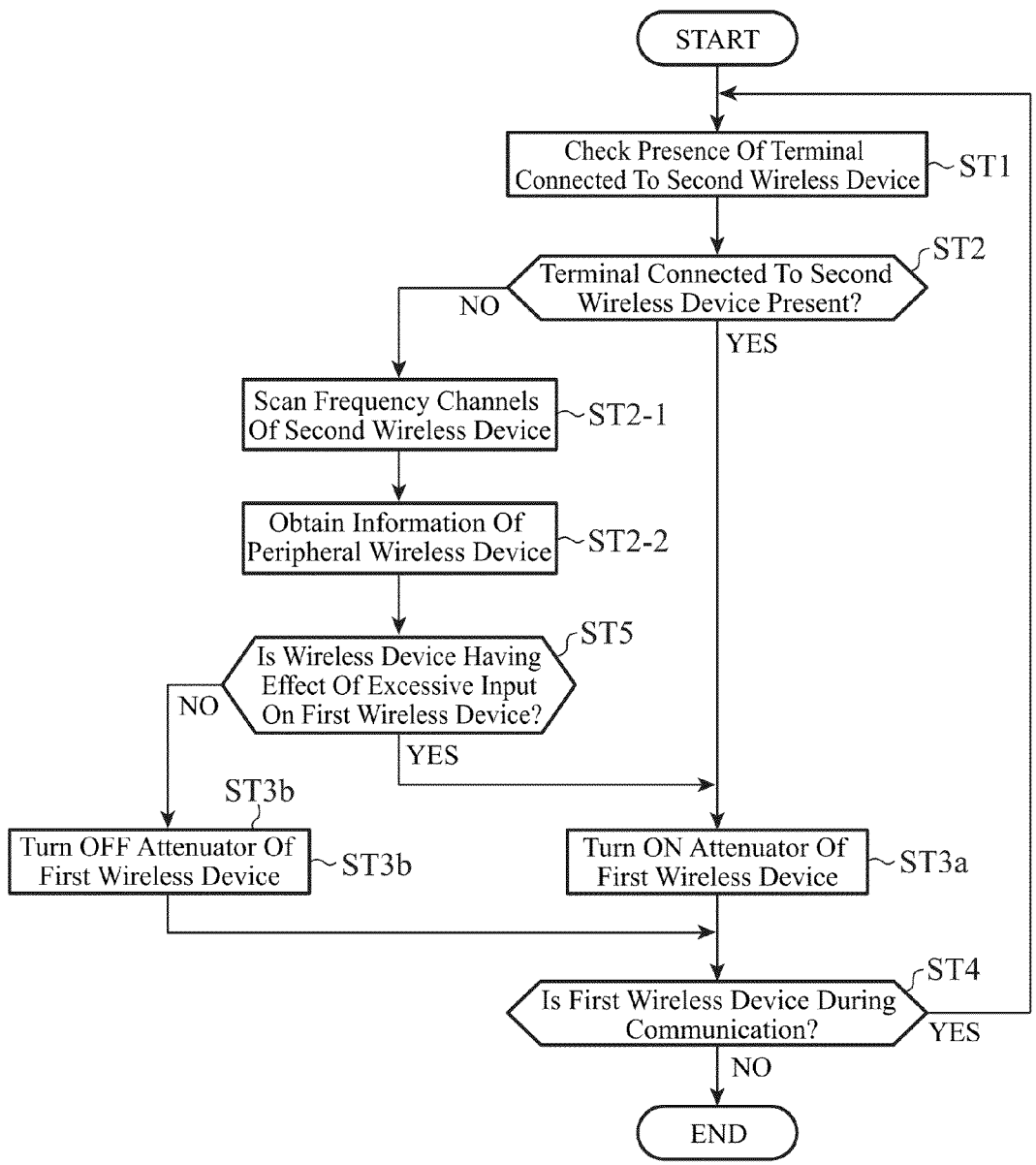
FIG. 13 is a flowchart showing an operation of the wireless communication apparatus according to Embodiment 2.

FIG. 13 is a flowchart showing the operation of the wireless communication apparatus according to Embodiment 2; as a different point different from that of FIG. 9, there is shown a case in which when the communication of the first wireless device 21 through Bluetooth is influenced by a wireless LAN of another wireless device other than those equipped by itself, control is performed such that the input level of the reception part of the first wireless device 21 is not subjected to the excessive input. In FIG. 13, the processing of step ST1 and step ST2 is the same as that of FIG. 9 described in the above Embodiment 1.

As a different point from those of Embodiment 1, if a terminal establishing communication connection with the second wireless device 22 through the wireless LAN is absent (NO at step ST2), in order to detect whether or not another wireless LAN terminal performs communication through the wireless LAN inside the vehicle 100 or in the vicinity outside the vehicle 100, the wireless device batch control unit 323 instructs the second wireless device 22 to perform frequency channel scan via the second wireless device control unit 322. Thus, the second wireless device 22 performs the frequency channel scan in a frequency band to be used by itself (step ST2-1), and receives transmission waves from the above wireless LAN terminal.

When the second wireless device 22 receives transmission waves from another wireless LAN terminal such as the information terminal 52, wireless rooter 53, and wireless LAN access point 54, the reception signal is demodulated by a modulation/demodulation unit 227a in a BB signal processor 227. After that, a wireless access control unit 227b analyses from the reception signal an ID (terminal ID) for identification of a wireless LAN terminal that is a transmission destination of this signal, a terminal type thereof (master station or slave station), and the reception level, and outputs the analysis results (information of neighbouring wireless devices) to a second wireless device state monitoring input unit 312 (step ST2-2).

Next, based on the terminal ID of the wireless LAN terminal, the terminal type thereof, and the reception level stored in a wireless device batch monitoring unit 313 via a first wireless device state monitoring input unit 311, a wireless device batch control unit 323 determines that the said wireless LAN terminal is a master station of the second wireless device 22, and that the said terminal is located inside the vehicle 100 or in the vicinity outside the vehicle 100, and whether or not the reception level will be the excessive input at the reception part of the first wireless device 21 (step ST5). In this case, for example, based on the terminal ID and the terminal type of the wireless LAN terminal, a determination is made that the wireless LAN terminal is located inside the vehicle 100 or in the vicinity outside the vehicle 100, and is the master station of the second wireless device 22, and further determines whether or not the reception level will be the excessive input at the reception part of the first wireless device 21 is determined by comparison results with a threshold of the reception level assumed as the excessive input and set in advance.

At this stage, if it is determined that the reception part of the first wireless device 21 will be the excessive input (YES at step ST5), the wireless device batch control unit 323 decides a control to attenuate the reception level of the first wireless device 21, and notifies the first wireless device control unit 321 of this control contents. For example, the decision of attenuating the reception level of the first wireless device 21 is made when the reception level of the first wireless device 21 is a threshold or more of the reception level that is assumed as the excessive input and set in advance, which leads to the excessive input.

The first wireless device control unit 321 sets an attenuator 212 to ON (attenuation implemented) in accordance with the control contents notified from the wireless device batch control unit 323 (step ST3a). In this manner, the excessive input at the reception part of the first wireless device 21, namely low-noise amplifier 214, is suppressed when the first wireless device 21 and the second wireless device 22 operate at the same time.

If it is determined that the input level of the reception part of the first wireless device 21 will not be the excessive input (NO at step ST5), the wireless device batch control unit 323 determines that there is no excessive input at the low-noise amplifier 214 due to the wireless LAN connection of the aforementioned neighbouring wireless LAN terminal, and notifies the first wireless device control unit 321 of this control contents. The first wireless device control unit 321 sets the attenuator 212 to OFF (attenuation not implemented) in accordance with the control contents notified from the wireless device batch control unit 323 (step ST3b).

Further, the wireless device batch control unit 323 determines whether or not the first wireless device 21 is during communication based on the connection terminal ID, use frequency channels, and reception levels stored in the wireless device batch monitoring unit 313 via the first wireless device state monitoring input unit 311 (step ST4).

At this stage, if the first wireless device 21 is during communication (YES at step ST4), the wireless device batch control unit 323 returns to step ST1 and repeats the processing of step ST1 to step ST4. This is repeatedly controlled at constant intervals (for example, 500 ms) since the communication state of the second wireless device 22 changes with the lapse of time even when of the first wireless device 21 is during communication.

On the other hand, if the first wireless device 21 is not during communication (NO at step ST4), the wireless device batch control unit 323 ends the communication control of the first wireless device 21.

In this way, also in Embodiment 2, while the batch monitoring unit 310 monitors the communication state of the second wireless device 22, the batch control unit 320 sets ON/OFF the attenuator 212 at the reception part of the first wireless device 21 according to the state of connection with the terminal. By doing so, the control can be performed such that degradation of reception performance due to the excessive input at the low-noise amplifier 214 is suppressed to thus prevent occurrence of reduction of the transmission efficiency.

As described above, according to Embodiment 2, the wireless device batch control unit 323 performs control to determine that when out of the wireless devices 21 and 22, the second wireless device 22 is during communication connection while the first wireless device 21 to be controlled is during communication connection, the input level of the reception signal of the first wireless device 21 will be excessive, and to attenuate the input level of the reception signal by operating the attenuator 212 of the first wireless device 21, and to determine that even when the second wireless device 22 is not during communication connection, in a case where a master station (wireless rooter 53 or wireless LAN access point 54) of a wireless device that performs a wireless communication using the same wireless communication system as that of the second wireless device 22 is detected, and the input level of the reception signal from the master station is equal to or higher than a predetermined threshold, the input level of the reception signal of the first wireless device 21 will be excessive, and to attenuate the input level of the reception signal by operating the attenuator 212 of the first wireless device 12, and to determine that when no master station of the wireless device is detected, or when the reception level of the master station is lower than a predetermined threshold, the input level of the reception signal of the first wireless device 21 will not be excessive, and to prevent the attenuation of the input level of the reception signal without operating the attenuator 212 of the first wireless device 21. By doing so, in a narrow closed space such as the vehicle 100 where radio waves hardly diffuse to the outside, degradation of reception performance of the wireless device (first wireless device 21) of its own due to a wireless communication of a wireless device (information terminal 52, wireless rooter 53, and wireless LAN access point 54) other than the wireless device of its own is suppressed to thus achieve an improvement of the communication quality.

In addition, according to this Embodiment 2, when the second wireless device 22 is not during communication connection, the wireless device batch control unit 323 causes the second wireless device 22 to perform frequency channel scan to thus detect a master station of a wireless device performing the communication using the same wireless communication system as that of the second wireless device 22; thus, the master station of the wireless device that performs the communication using the same wireless communication system as the second wireless device 22 can be detected precisely.

Additionally, in the configuration shown in FIG. 3 of the Embodiments 1 and 2, when the attenuator 212 of the first wireless device 21 is operated, the transmission power of the first wireless device 21 also be attenuated.

Thus, in order to enhance the ratio of the radio waves of the wireless LAN of the second wireless device 22, which are apparently interfering waves for the first wireless device 21, to those of Bluetooth-based communication of the first wireless device 21 itself (D/U: Desired to Undesired signal ratio), a control may be performed that the output power of the transmission amplifier 215 is increased within a range that the communication partner of the first wireless device 21 is not subjected to the excessive input. By doing so, a decrease in the transmission efficiency of the communication through Bluetooth is suppressed.

The present invention may be changed within the scope thereof; the embodiments may be freely combined, or any given constituent element of each embodiment may be modified, or any given constituent element in each embodiment may be omitted.

INDUSTRIAL APPLICABILITY

Since the wireless communication apparatus according to this invention incorporates the plurality of wireless communication systems using the same frequency band and controls the reception input level and transmission output power while monitoring the communication states of respective wireless communication systems to suppress the decrease of the transmission efficiency, it is preferable for a wireless communication apparatus to be used in a vehicle in which a closed space that makes the reception input level excessive tends to be formed.

10: in-vehicle information apparatus
11, 11A: wireless communication apparatus
21, 21A: first wireless device
22, 22A: second wireless device
24: first antenna
25: second antenna 30: batch monitoring control unit
51: mobile phone
52: information terminal
53: wireless rooter
54: wireless LAN access point
55: installation fixed wireless device
211, 221: band-pass filter (BPF)
212, 222: attenuator
213, 223: transmission/reception changeover switch
214, 224: low-noise amplifier
215, 225: transmission amplifier
216, 226: frequency conversion unit
217, 227: baseband (BB) signal processor
217a, 227a: modulation/demodulation unit
217b, 227b: wireless access control unit
310: batch monitoring unit
311: first wireless device monitoring unit
312: second wireless device monitoring unit
313: wireless device batch monitoring unit
320: batch control unit
321: first wireless device control unit
322: second wireless device control unit
323: wireless device batch control unit.

The invention claimed is:

1. A wireless communication apparatus equipped with a plurality of wireless devices having different wireless communication systems using the same frequency band, the apparatus comprising:
an attenuator that is provided in each of the wireless devices and that attenuates an input level of a reception signal;
a monitoring unit that monitors communication states of the wireless devices; and
a control unit that performs control to determine whether or not the input level of the reception signal of the wireless device to be controlled out of the plurality of wireless devices of the wireless communication systems will be excessive because of a wireless communication to be performed by the other wireless device other than the wireless device to be controlled, based on the communication states of the wireless devices monitored by the monitoring unit, and to attenuate the input level of the reception signal by operating the attenuator of the wireless device to be controlled when a determination is made that the input level of the reception signal will be excessive, wherein the control unit performs control
to determine that when out of the plurality of wireless devices of the wireless communication systems, at least one of the other wireless devices other than the wireless device to be controlled is during communication connection while the wireless device to be controlled is during communication connection, the input level of the reception signal of the wireless device to be controlled will be excessive, and to attenuate the input level of the reception signal by operating the attenuator of the wireless device to be controlled,
to determine that even when the other wireless device is not during communication connection, in a case where a master station of a wireless device that performs a wireless communication using the same wireless communication system as that of the other wireless device is detected and the input level of the signal received from the master station is equal to or higher than a predetermined threshold, the input level of the reception signal of the control target wireless device will be excessive, and to attenuate the input level of the reception signal by operating the attenuator of the wireless device to be controlled, and
to determine that when no master station of the wireless device is detected, or when the reception level of the master station is lower than a predetermined threshold, the input level of the reception signal of the wireless device to be controlled will not be excessive, and to prevent the attenuation of the input level of the reception signal without operating the attenuator of the wireless device to be controlled.

2. A wireless communication apparatus mounted with a plurality of wireless devices having different wireless communication systems using the same frequency band, the apparatus comprising:
an attenuator that is provided in each of the wireless devices and that attenuates an input level of a reception signal;
a monitoring unit that monitors communication states of the wireless devices; and
a control unit that performs control to determine whether or not the input level of the reception signal of the wireless device to be controlled out of the plurality of wireless devices of the wireless communication systems will be excessive because of a wireless communication to be performed by the other wireless device other than the wireless device to be controlled, based on the communication states of the wireless devices monitored by the monitoring unit, and to attenuate the input level of the reception signal by operating the attenuator of the wireless device to be controlled when a determination is made that the input level of the reception signal will be excessive,
wherein the monitoring unit preliminarily stores an ID for identifying a wireless communication terminal that is to be a communication partner, an installation position of the wireless communication terminal, and an amount of attenuation with which the input level of the reception signal of the wireless device to be controlled is attenuated when the other wireless device other than the wireless device to be controlled performs a wireless communication with the wireless communication terminal at the installation position, and
the control unit performs control to determine that the input level of the reception signal of the control target wireless device will be excessive when a detection is made that the wireless device other than the wireless device to be controlled is during wireless communication with the wireless communication terminal, based on communication states of the wireless devices monitored by the monitoring unit, the ID, and the installation position, and to attenuate the input level of the reception signal in accordance with the amount of attenuation stored in the monitoring unit by operating the attenuator of the wireless device to be controlled.

3. The wireless communication apparatus according to claim 1, wherein when the other wireless device is not during communication connection, the control unit causes the other wireless device to perform frequency channel scan to detect the master station of the wireless device performing the communication using the same wireless communication system as that of the other wireless device.

* * * * *